United States Patent
Chang et al.

(10) Patent No.: US 8,225,050 B2
(45) Date of Patent: *Jul. 17, 2012

(54) MEMORY STORAGE DEVICE AND A CONTROL METHOD THEREOF

(75) Inventors: Li-Pin Chang, Banciao (TW); Ming-Dar Chen, Hsinchu (TW)

(73) Assignee: A-Data Technology Co., Ltd., Taipei (TW)

( * ) Notice: Subject to any disclaimer, the term of this patent is extended or adjusted under 35 U.S.C. 154(b) by 512 days.

This patent is subject to a terminal disclaimer.

(21) Appl. No.: 12/457,402

(22) Filed: Jun. 10, 2009

(65) Prior Publication Data

US 2010/0169586 A1    Jul. 1, 2010

(30) Foreign Application Priority Data

Dec. 31, 2008    (TW) ................................ 97151552 A

(51) Int. Cl.
*G06F 12/00*    (2006.01)

(52) U.S. Cl. . 711/154; 711/103; 711/171; 711/E12.001; 711/E12.009; 365/185.33

(58) Field of Classification Search ........................ None
See application file for complete search history.

(56) References Cited

U.S. PATENT DOCUMENTS

| | | | | |
|---|---|---|---|---|
| 6,643,188 | B2 * | 11/2003 | Tanaka et al. | 365/189.16 |
| 2006/0155919 | A1 * | 7/2006 | Lasser et al. | 711/103 |
| 2008/0189473 | A1 * | 8/2008 | Murray | 711/103 |
| 2008/0225589 | A1 * | 9/2008 | Aritome et al. | 365/185.03 |
| 2008/0294869 | A1 * | 11/2008 | Erez | 711/209 |
| 2009/0100244 | A1 * | 4/2009 | Chang et al. | 711/172 |
| 2009/0106484 | A1 * | 4/2009 | Yeh et al. | 711/103 |
| 2009/0150597 | A1 * | 6/2009 | Yang et al. | 711/103 |
| 2009/0172256 | A1 * | 7/2009 | Chu et al. | 711/103 |
| 2009/0175075 | A1 * | 7/2009 | Yeh et al. | 365/185.03 |
| 2009/0259801 | A1 * | 10/2009 | Kilzer et al. | 711/103 |
| 2009/0265505 | A1 * | 10/2009 | Yang et al. | 711/103 |
| 2009/0307413 | A1 * | 12/2009 | Chu | 711/103 |
| 2010/0011153 | A1 * | 1/2010 | Yeh | 711/103 |
| 2010/0205352 | A1 * | 8/2010 | Chu et al. | 711/103 |

* cited by examiner

*Primary Examiner* — Michael Krofcheck
(74) *Attorney, Agent, or Firm* — Rosenberg, Klein & Lee

(57) ABSTRACT

The present invention discloses a control method of a memory storage device which includes a high density memory. The high density memory is composed of a plurality of MSB pages and LSB pages. The major feature of the method is such that it determines the property of data by its data length, and then decides where the data is to be written according to its property.

18 Claims, 5 Drawing Sheets

MEMORY STORAGE DEVICE AND A CONTROL METHOD THEREOF

BACKGROUND OF THE INVENTION

1. Field of the Invention

The present invention generally relates to a storage device and a method; in particular, to a memory storage device and a control method thereof.

2. Description of Related Art

Non-volatile memory (also referred as non-electrically dependant memory) can be used in data storage, which is generally applied in various storage devices, such as a memory card, USB thumb drive, Solid State Drive (SSD) and so on. Flash memory demonstrates advantages of, for example, high storage density, low power consumption, effective access efficiency, and reasonable manufacturing cost, thereby allowing itself to play the major role in current non-volatile memory development.

Typically, common non-volatile memory entirely utilizes Multi-Level-Cell (MLC) memory or Single-Level-Cell (SLC) memory, wherein a memory composed of MCL is known as high density memory, and a memory composed of SCL is known as low density memory. Compared with the low density memory, the data storage capacity per unit area in the high density memory may increase multiple times, hence providing advantages of greatly enhanced storage capacity and cost reduction, but whose required time for data read/write operations, programming processes, and erase actions is longer; furthermore, MLC process technologies result in less erase cycles that can be endured by a high density memory, thus collaterally affecting the data access speed and life span of the storage devices using the high density memory.

In view of the features of large storage capacity and low cost found in the high density memory, but having slower data access rate and less endurance counts, whereas the low density memory providing the features of faster data access rate and more endurance counts with smaller storage capacity and higher manufacturing cost, accordingly a type of memory formed by the aforementioned two densities of memories in one single storage device is developed, referred as the hybrid density memory.

At present, the storage device comprising the hybrid density memory commonly available in the industry usually records more frequently used data by means of the low density memory, while recording less frequently used data with the high density memory; however, in regard to the limited storage capacity of the low density memory, planning of the approaches for new/old data processes may affect the operation performance of the hybrid density memory storage device; besides, since there exist differences in the erasure counts that memory of different density can possibly endure, and upon update or access to the data stored in the memory, the block holding the data will be erased, therefore further leading to uneven erasure results in these two types of memory having different density, so that it is accordingly inevitable to confront upon a scenario that the memory of one density may reach the endurance count limit first, while the memory having the other density is still operable, thus undesirably ending prematurely the life span of the storage device.

SUMMARY OF THE INVENTION

Therefore, the objectives of the present invention are directed to provide a memory storage device and a control method thereof so as to alleviate or eliminate the problems found in prior art.

A control method of a memory storage device is herein disclosed which can be used to allocate at least one write data transferred from a host to a memory storage device. The storage device has a high density memory unit, the high density memory unit is divided into a plurality of first type of pages and a plurality of second type of pages, wherein the time required for writing to the second type of pages is shorter than the one needed for the first type of pages. The control method comprises the following steps: initially, performing a hot data filter procedure, the hot data filter procedure is for comparing the data length of the write data with a threshold so as to identify the property of the write data; next, determining the allocation position of the write data based on the comparison, and if the data length of the write data is less than the threshold, then allocating the write data to the second type of page; otherwise, allocating the write data to the first type of page as well as the second type of page.

By means of the above-mentioned technical solution, the present invention may utilize the feature of paired page in the high density memory, thus storing the data more frequently updated (i.e. hot data) to the pages providing faster programming operations, thereby shortening the programming time and thus extending the life span of the storage device.

The above-illustrated summary and the detailed descriptions as well as appended drawings provided hereinafter are all for the purposes of further explaining the approaches, means, and effects taken by the present invention to achieve the prescribed goals. Other objectives and advantages related to the present invention will be set forth in the following descriptions and figures.

DETAILED DESCRIPTION OF THE PREFERRED EMBODIMENTS

The memory storage device and control method thereof disclosed in the specification of the present invention are to, initially, identify the property of the write data transferred from a host, allocate the more frequently updated write data (i.e. hot data) to the pages of high density memory offering faster programming operations, so as to accordingly accelerate programming speed and enhance the effect of use and life span of the memory device.

The essential technical characteristics of the present invention lie in the control method for data allocation as well as the memory storage device architecture using the aforementioned method, herein the critical internal system architecture and the action procedures thereof will be discussed hereafter; however, those skilled ones in the art can appreciate that, in addition to the elements illustrated in the following texts, other components may also be included in the memory storage device; hence, it is by no means and unnecessary to be limited by what is disclosed in the present embodiments.

Figure 1:
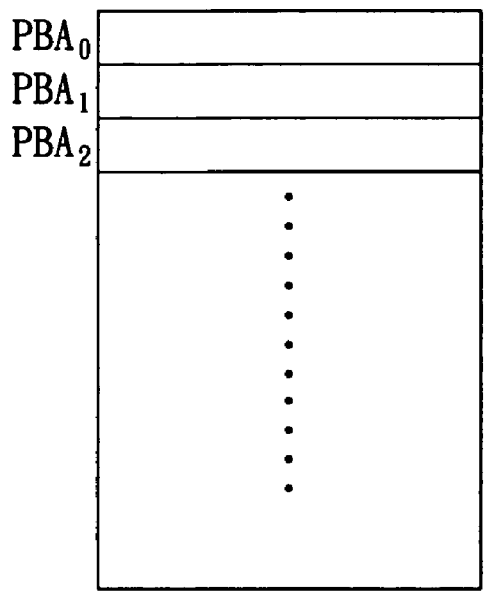
FIG. 1 is a diagram for an embodiment of a high density memory unit according to the present invention.
Figure 2:
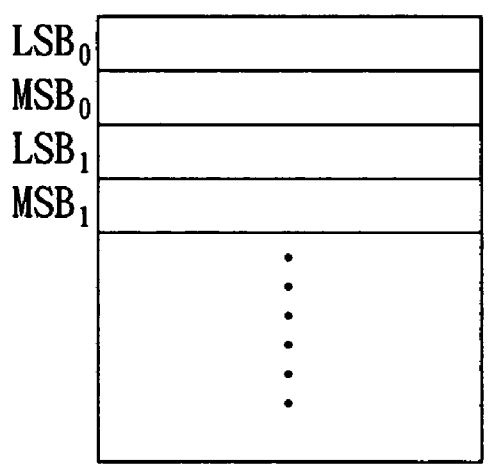
FIG. 2 is a diagram for an embodiment of a physical block address (PBA) according to the present invention.

First of all, refer to FIG. 1, wherein a diagram for an embodiment of a high density memory unit according to the present invention is shown. As depicted in FIG. 1, a high density memory unit 1 composed of high density memory defines a continuous plurality of physical block addresses $PBA_0, PBA_1, PBA_2, \ldots$, each $PBA_i$ having a plurality of first type of pages and a plurality of second type of pages, as shown in FIG. 2; and since the high density memory has a property of paired page, the said first type of memory indicates the most significant bit page (MSB Page or upper page) $MSB_0, MSB_1, MSB_2, \ldots$; while the second type of memory represents the least significant bit page (LSB Page or lower page) $LSB_0, LSB_1, LSB_2, \ldots$.

Figure 3A:
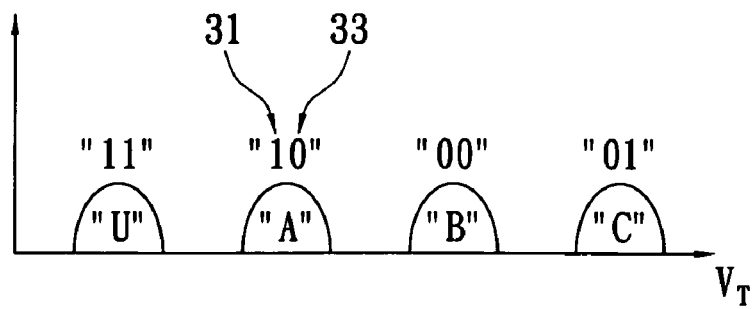
FIGS. 3A-3C are diagrams illustrating state changes in an embodiment of the high density memory unit according to the present invention.

The reason why the high density memory is referred as "high density" is essentially in that each memory cell therein can be under four states, as shown in FIG. 3A, with each cell comprising two bits for determining four states, "U", "A", "B", and "C", wherein the two bits being the MSB 31 and the LSB 33 respectively located on different pages, and those $MSB_i$ page and $LSB_i$ page belonging to the same memory cell are referred as the paired page.

Figure 3B:
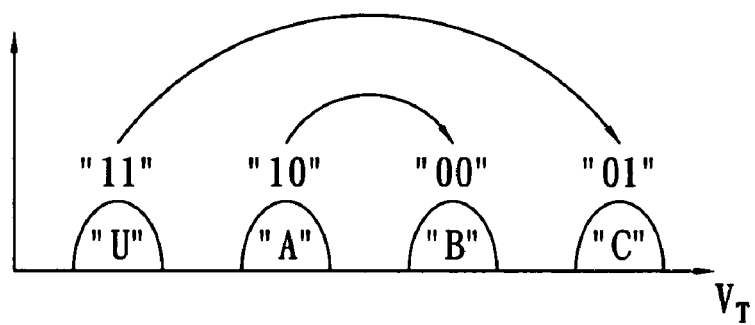

Upon writing data to the $MSB_i$ page, as shown in FIG. 3B, it is necessary to program the memory cell from state "U" to state "C", or from state "A" to state "B", thereby converting the bit indicating the MSB 31 from logic 1 to logic 0. On the other hand, in case that the state of the memory cell in the MSBi is kept in "A" or in "U", then it indicates the MSB 31 as logic 1.

Figure 3C:
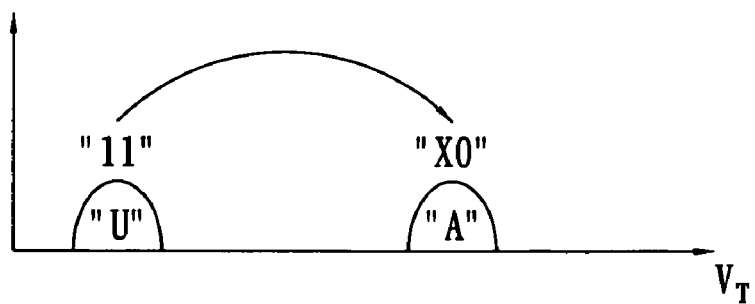

Meanwhile, upon writing data to the $LSB_i$ page, as shown in FIG. 3C, it can maintain the memory cell in state "U" so as to indicate the LSB 33 as logic 1. Whereas, if the memory cell is programmed to state "A", then it may indicate the LSB 33 as logic 0. In this way, one memory cell is required to maintain only two lower power levels to handle two states, so, suppose only the LSBi pages of the high density memory unit are utilized to record data, then the effect and speed thereof may present results similar to the use of low density memory unit.

Figure 4:
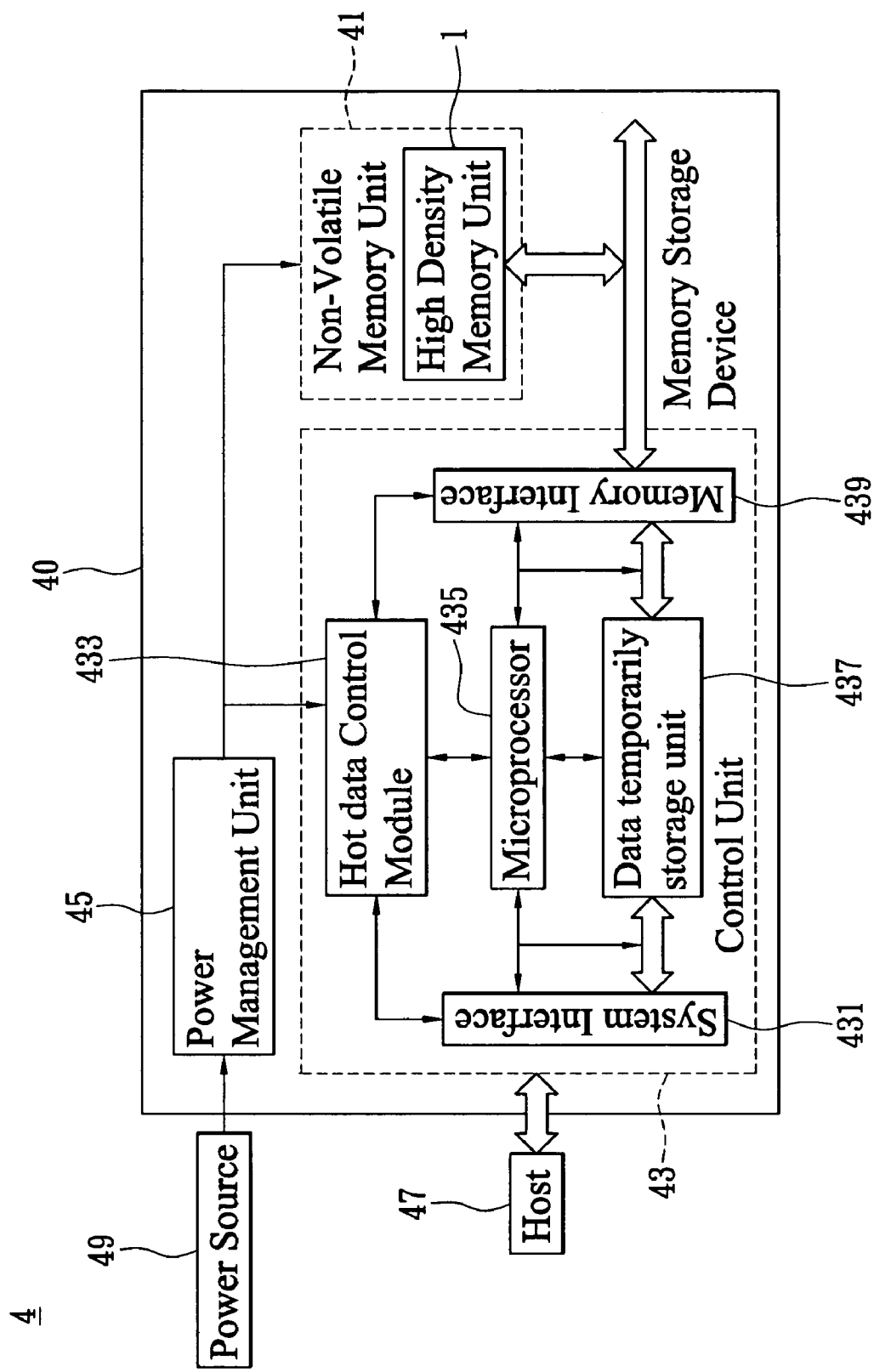
FIG. 4 is a system architecture diagram of a memory storage device according to the present invention.

Next, refer to FIG. 4, wherein a system architecture diagram of the memory storage device according to the present invention is shown. As depicted in FIG. 4, a memory storage device 40 (briefly referred as storage device hereafter) is applied in a digital system 4 to work conjunctively on data read/write operations. In the digital system 4, the memory storage device 40 is coupled to a host 47 and receives commands from the host 47 to operate. In practice, the host 47 may be a computer system, while the storage device 40 may be a solid state drive of such a computer system.

The storage device 40 comprises a non-volatile memory unit 41, a control unit 43, and a power management unit 45. The non-volatile memory unit 41 is composed of flash memory which includes a high density memory unit 1, or alternatively comprising the low density memory (not shown) as well so as to form a hybrid memory storage device. The high density memory unit 1 is a Multi-Level-Cell (MLC) memory providing features of higher storage capacity, less erasure endurances, lower data access rate and the like.

The power management unit 45 is coupled to a power source 49 so as to receive electrical power outputted thereby, and converts the received power into the power that the control unit 43 and the non-volatile memory unit 41 need for operations.

The present invention manages the file data archived in the storage device 40 in accordance with the system architecture specified in the FAT12, FAT16, FAT32, or NTFS file systems. Through the address translation table predefined by the firmware in the microprocessor 435, the logical blocks of the file data in the file system is mapped into the physical addresses of the non-volatile memory unit 41.

The control unit 43 is coupled between the host 47 and the non-volatile memory unit 41, the control unit 43 receiving a command issued from the host 47, the command may be either a write command or a read command, wherein the write command writes the data corresponding to a logical block address to the non-volatile memory unit 41, and the read command reads the data in a logical block address from within the non-volatile memory unit 41. The control unit 43 consists of a system interface 431, a hot data control module 433, a microprocessor 435, a data temporarily storage unit 437, and a memory interface 439. The system interface 431 is coupled to the host 47 for receiving the command issued from the host 47 and transferring the data corresponding to the command. The hot data control module 433 is coupled to the system interface 431 to identify the property of the data pointed by the command so as to allocate the data to the appropriate memory address. The microprocessor 435 is coupled to the system interface 431 and the hot data control module 433 for controlling the command operations performed by each unit within the storage device 40; that is, upon reception of the command by the microprocessor 435, it transfers the data pointed by the command to the hot data control module 433 for determining data property, afterward it performs suitable process on the data based on the determination. The data temporarily storage unit 437 is coupled to the system interface 431 for temporarily storing the data passed to the storage device 40 by the host 47 or for temporarily storing the data to be read from the storage device 40 by the host 47. The memory interface 439 is coupled between the data temporarily storage unit 437 and the non-volatile memory unit 41, wherein the memory interface 439 is used as the data transmission interface between the control unit 43 and the non-volatile memory unit 41.

Figure 5:
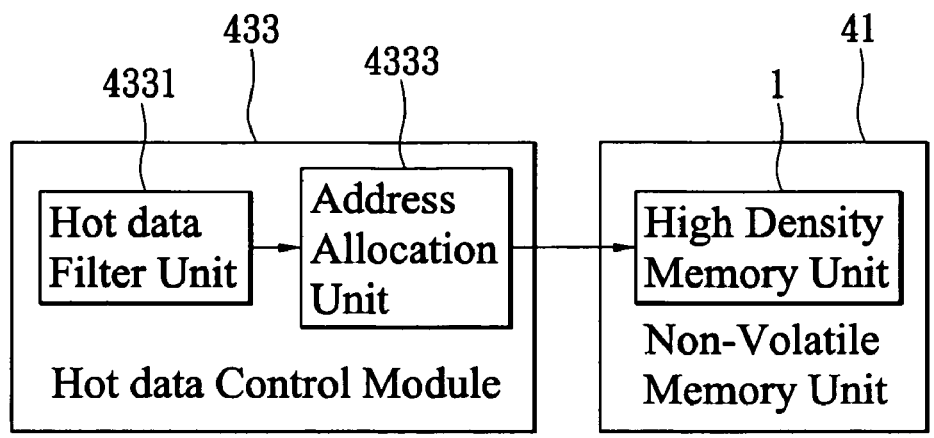
FIG. 5 is a system architecture diagram for an embodiment of a hot data control module according to the present invention.

Subsequently, refer conjunctively to FIGS. 4 and 5. FIG. 5 shows a system architecture diagram for an embodiment of the hot data control module according to the present invention. As depicted in FIG. 5, the hot data control module 433 is coupled to the non-volatile memory unit 41, wherein the non-volatile memory unit 41 has a high density memory unit 1. The host 47 transfers the data corresponding to the issued command (referred as write data hereafter) to the hot data control module 433, and, based on the property of the write data, the hot data control module 433 allocates the write data to the LSB page, or the MSB page and LSB page, in the high density memory unit 1.

The hot data control module 433 consists of a hot data filter unit 4331 and an address allocation unit 4333. The hot data filter unit 4331 receives the write data and identifies the data property thereof based on the length of the write data. The address allocation unit 4333 is coupled between the hot data filter unit 4331 and the high density memory unit 1, and the address allocation unit 4333 is for allocating the write data to the suitable address in accordance with identified property thereof. In practice, suppose the data length of the write data is shorter than a prescribed threshold, then the hot data filter unit 4331 determines the write data to be a hot data (i.e. frequently updated data) and the address allocation unit 4333 gives the address of $LSB_i$ page for write data allocation; otherwise, it determines the write data to be an non hot data (i.e. not frequently updated data), and the write data is allocated to both the MSB$_i$ page and LSB$_i$ page in a common approach for data writing to the high density memory unit 1.

In the present invention, the property of the write data is determined based on the comparison of the length of the write data with a threshold. Such a threshold can be a system setting or a user setting, which may also be adjusted according to the property of the write data. For example, the hot data filter unit 4331 may perform statistical operations on the addresses and lengths occurring in the past N write data, then analyze among such N write data to see the data presenting higher repetition in address thereof falls within what range of data length. Assuming it is analyzed that the data length of write data demonstrating higher repetition is in the range of less than (or equal to) 4 KB, the threshold can be set to 4 KB. For the following write data, if the data length thereof is shorter than (or equal to) 4 KB, then it is determined to be the hot data, otherwise, to be the non hot data. Additionally, setting of the threshold may also be updated once every receptions of N write data; or, after receptions of N write data and analysis of the threshold, the threshold can further be updated once every receptions of subsequent M write data (wherein N≠M, and N, M≧1). In this way, it is possible to dynamically modify the definition of the hot data by means of the statistics on the write data. Suppose the storage device 40 was newly started and no threshold is available, it is possible to preset an initial threshold in the hot data filter unit 4331 or load a threshold recorded from the previous operations, allowing for the determination of the property of the first few write data.

Figure 6:
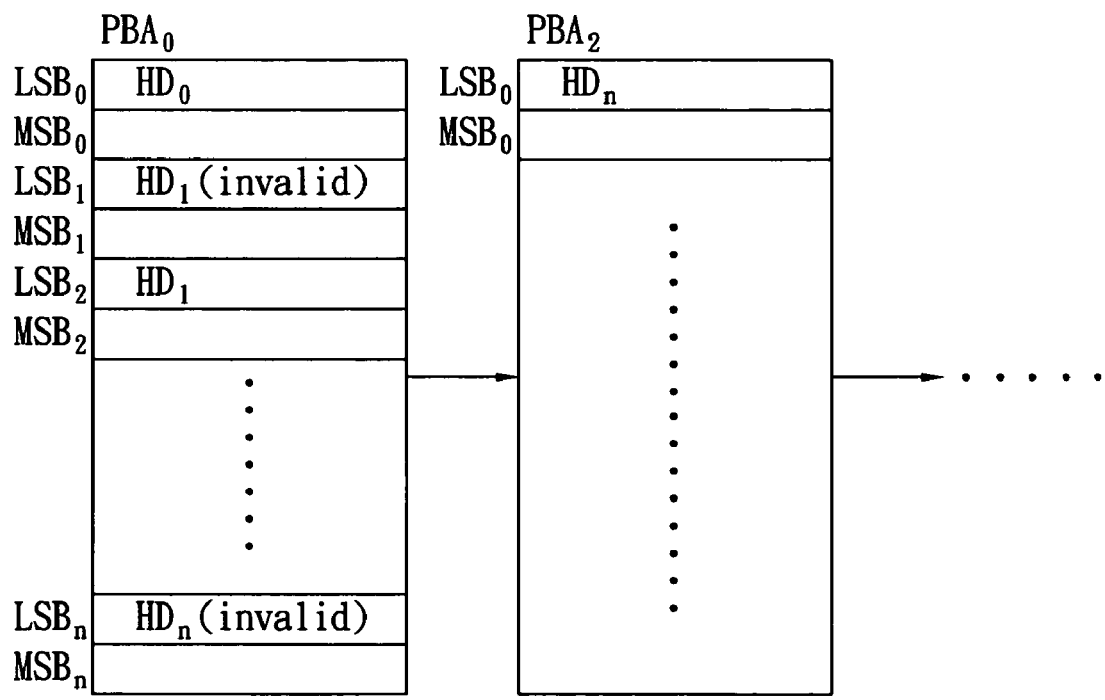
FIG. 6 is a data allocation diagram for an embodiment of the high density memory unit according to the present invention.

In the high density memory unit 1, if one physical block for data storage is full, then the address allocation unit 4333 assigns another erased physical block to store data, wherein the later physical block is a sub-block of the former physical block, and there exists a linkage connection between them (which can be found in the logical address translation table, or may be managed by a linkage table), so as to facilitate a physical block to locate its own sub-block address. Refer to FIG. 6, wherein a data allocation diagram for an embodiment of the high density memory unit according to the present invention is shown. As illustrated in FIG. 6, assuming that there exist hot data HD$_0$, HD$_1$, . . . , HD$_n$, and data is to be written in the high density memory unit 1 according to the update sequence HD$_0$, HD$_1$, HD$_1$, . . . , HD$_n$, HD$_n$, thus after address allocation by the address allocation unit 4333, the microprocessor 435 controls to write hot data HD$_0$, HD$_1$ respectively to the LSB$_0$, LSB$_1$ pages of the PBA$_0$; upon later updated HD$_1$ to be written therein, it will be consecutively recorded at the LSB$_2$ page, and the data recorded in the LSB$_1$ will be marked as invalid. The following hot data write operations will be performed likewise, and after having the HD$_n$ stored in the LSB$_n$ page of the PBA$_0$, in case an updated HD$_n$ is received, the address allocation unit 4333 will alternatively allocate an erased PBA$_2$ for writing subsequent hot data; accordingly, the updated hot data HD$_n$ is written in the LSB$_0$ page of the PBA$_2$, and the data in the LSB$_n$ page of the PBA$_1$ is marked as invalid. In the present embodiment, the PBA$_2$ is a sub-block of the PBA$_1$, and the PBA$_2$ may further link to more sub-blocks for data storage.

When the number of erased physical blocks in the high density memory unit 1 available for data storage becomes less than a prescribed value, wherein the prescribed value being the number redundant blocks in one embodiment, then the microprocessor 435 starts a block recycle procedure; that is, all valid data in the physical blocks (e.g. PBA$_0$, PBA$_1$) having linkage connections will be collected and stored in another erased physical block, and the data in such physical blocks originally having linkage connections will be erased for writing other data. In addition to the above-illustrated condition, the system may also perform the block recycle procedure in case all data recorded in any one of the physical blocks become entirely invalid, thereby erasing such physical blocks for later data write operations.

Figure 7:
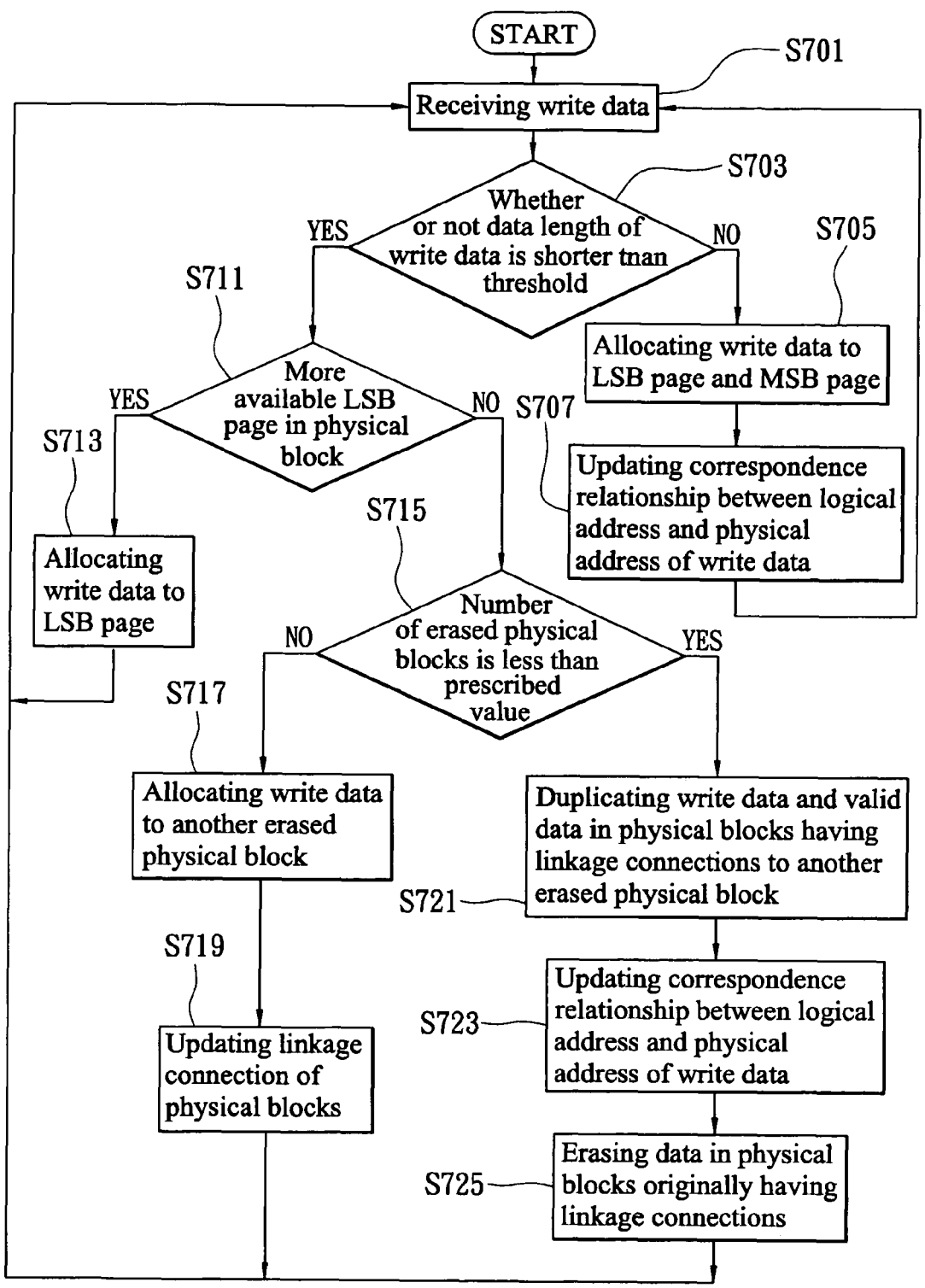
FIG. 7 is a stepwise flowchart for an embodiment of a control method of the high density memory unit according to the present invention.

Finally, refer to FIG. 7, wherein a stepwise flowchart for an embodiment of a control method of the high density memory unit according to the present invention is shown. Relevant system architecture may be conjunctively referred to FIG. 4. As shown in FIG. 7, the control method comprises the following steps:

initially, the hot data filter unit 4331 receives a write data (step S701); next, a hot data filter procedure is performed (step S703) for determining whether or not the data length of the received write data is shorter than a threshold; if not, then the microprocessor 435 allocates the write data in the MSB$_i$ and LSB$_i$ (step S705); and then updates the correspondence relationship between the logical address and the physical address of the stored write data (step S707), afterward the method continues to receive the next write data;

suppose the determination in step S703 is positive, the method determines whether or not there still exists any available LSB page in the physical block (step S711); if yes, then the microprocessor 435 controls to allocate the write data to the LSB$_j$ based on the address given by the address allocation unit 4333 (step S713);

in case that the determination in step S711 is negative, indicating currently there is no available LSB page for further data storage, then the method determines whether or not the number of erased physical blocks is less than a prescribed value (step S715) so as to verify whether or not the condition of block recycle procedure initiation is satisfied; if the determination in step S715 is no, meaning that the number of erased physical blocks is not less than a prescribed value, then the address allocation unit 4333 allocates another erased physical block to allow the write data to be written to the LSB page in the newly allocated physical block (step S717); and also updates the linkage connections of physical blocks (step S719), that is, a parent-child relationship is built between the original physical block and the new physical block, and subsequently updates the correspondence relationship between the logical address and the physical address of the stored write data based on the allocation address;

whereas if the determination in step S715 is yes, meaning that the number of erased physical blocks is less than a prescribed value, thus indicating the condition of block recycle procedure initiation is satisfied, then the write data together with the valid data in the physical blocks having linkage connections are duplicated to another erased physical block (step S721), and the correspondence relationship between the logical address and the physical address of the stored write data is updated based on the allocation address (step S723); finally, the data in the physical blocks originally having linkage connections are erased for later data writes (step S725), and the method continues to receive the next write data.

Through the aforementioned embodiments, it can be appreciated that the memory storage device and the control method thereof according to the present invention adjusts the threshold for identifying hot data based on the analysis of data length and consistent detection over write data, further recording hot data in the LSB pages of the high density memory, while non hot data is allocated to LSB pages and MSB pages in a common approach for writing data to the high density memory, thereby fully exploiting the feature that characteristics of data programming in the LSB page is similar to the ones for the low density memory, thus enabling effective improvement on write speed of high density memory, and further increasing operation performance and life span of the memory devices.

The illustrations set forth hereinbefore simply provide the detailed descriptions and drawings of the present invention, rather then being intended to restrict the present invention thereto. The scope of the present invention should be based on the following claims, and all changes, modifications, and alternations that any skilled ones in the art may conveniently consider in the field of the present invention are deemed to be encompassed within the definition of the present invention delineated by the following claims.

What is claimed is:

1. A control method of a memory storage device for allocating at least one write data to the memory storage device, wherein the memory storage device has a high density memory unit, having a plurality of first type of pages and a plurality of second type of pages, with writing the write data to the second type of pages takes a shorter period of time than the writing the write data to the first type of pages, the control method comprising:
    performing a hot data filter procedure for comparing a data length of the write data with a threshold so as to identify a property of the write data; and
    allocating the write data to the second type of page, or to the first type of page and second type of page, based on the property of the write data;
    wherein the threshold is determined by performing statistical operations on a plurality of access data continuously received before the write data to obtain address repetitions of the access data, and averaging data lengths of the access data that are large in number of the address repetitions.

2. The control method according to claim 1, when the data length of the write data is shorter than the threshold, further comprising labeling the write data as a hot data and allocating the write data to the second type of page; otherwise labeling the write data as an non hot data and allocating the write data to the first type of page and second type of page.

3. The control method according to claim 2, further comprising performing a recycle procedure.

4. The control method according to claim 3, wherein the high density memory unit defines a continuous plurality of physical blocks, and each physical block has the plural first type of pages and the plural second type of pages.

5. The control method according to claim 4, wherein the write data is sequentially allocated to the second type of page.

6. The control method according to claim 4, wherein when a first physical block for an allocation of the write data is full, further comprising using a second physical block that has been erased for the allocation of the write data, while the second physical block is a sub-block of the first physical block with an linkage connection existing between the first physical block and the second physical block.

7. The control method according to claim 6, wherein the recycle procedure comprises the following step:
    when all data recorded in the first physical block are invalid, comprising erasing the first physical block.

8. The control method according to claim 7, further comprising the following steps:
    updating a correspondence relationship between a logical address and a physical address of the write data; and
    updating the linkage connection of the first and the second physical blocks.

9. The control method according to claim 6, wherein the recycle procedure comprising the following steps:
    determining whether a number of erased physical blocks is less than a prescribed value;
    when the determination is yes, collecting valid data in the first and the second physical blocks having the linkage connections and storing the valid data in the first and the second physical blocks into a third physical block which has been erased; and
    erasing the valid and collected data in the first and the second physical blocks having the linkage connections.

10. The control method according to claim 9, further comprising the following steps:
    updating a correspondence relationship between a logical address and a physical address of the write data; and
    updating the linkage connection of the first and the second physical blocks.

11. The control method according to claim 1, wherein the second type of page is the Least Significant Bit (LSB) page, and the first type of page is the Most Significant Bit (MSB) page.

12. A hot data control module applicable for accessing at least one write data from a high density memory unit, the high density memory unit including a plurality of first type of pages and a plurality of second type of pages, comprising:
    a hot data filter unit, for comparing a data length of the write data with a threshold before identifying a property of the write data; and
    an address allocation unit, coupled between the hot data filter unit and the high density memory unit to allocate the write data to the second type of page, or the first type of page and the second type of page, based on the property of the write data;
    wherein the threshold is determined by a performance of statistical operations on a plurality of access data continuously received before the write data to obtain address repetitions of the access data, and by having data lengths of the access data averaged for identifying the plurality of the access data that are large in number of the address repetitions.

13. The hot data control module according to claim 12, wherein when the data length of the write data is shorter than the threshold, the hot data filter unit labels the write data as a hot data and the address allocation unit allocates the hot data to the second type of page, otherwise the hot data filter unit labels the write data as an non hot data and the address allocation unit allocates the non hot data to the first type of page and the second type of page.

14. The hot data control module according to claim 12, wherein the second type of page is the Least Significant Bit (LSB) page, and the first type of page is the Most Significant Bit (MSB) page.

15. A memory storage device, which is cooperatively used with a host to access at least one write data, comprising:
    a non-volatile memory unit, including a high density memory unit, including a plurality of first type of pages and a plurality of second type of pages; and
    a control unit, coupled between the host and the non-volatile memory unit, the control unit facilitating allocating the write data to the second type of page, or the first type of page and the second type of page, based on a property of the write data, wherein the control unit comprises:
        a system interface coupled to the host and serving to receive and transmit command and data between the host and the memory storage device;
        a hot data filter unit, comparing a data length of the write data with a threshold for identifying the property of the write data; and
        an address allocation unit, coupled between the hot data filter unit and the high density memory unit and controlled by the control unit to allocate the write data to the second type of page, or the first type of page and the second type of page, based on the property of the write data; and a microprocessor, coupled to the system interface and the hot data filter unit for transferring the write data to the hot data filter unit;

wherein the threshold is determined by having statistical operations on a plurality of access data continuously received before the write data performed to obtain address repetitions of the access data, and having data lengths of the access data averaged to identify the access data that are large in number of the address repetitions.

16. The memory storage device according to claim 15, wherein the control unit further comprises:

a data temporarily storage unit, coupled to the system interface for temporarily storing the write data; and a memory interface, coupled between the data temporarily storage unit and the non-volatile memory unit for transferring the write data under the control of the microprocessor.

17. The memory storage device according to claim 15, wherein when the data length of the write data is shorter than the threshold, the hot data filter unit labels the write data as a hot data and the address allocation unit allocates the hot data to the second type of page, otherwise the hot data filter unit labels the write data as an non hot data and the address allocation unit allocates the non hot data to the first type of page and the second type of page.

18. The memory storage device according to claim 15, wherein the second type of page is the Least Significant Bit (LSB) page, and the first type of page is the Most Significant Bit (MSB) page.

* * * * *

UNITED STATES PATENT AND TRADEMARK OFFICE
CERTIFICATE OF CORRECTION

| | | |
|---|---|---|
| PATENT NO. | : 8,225,050 B2 | Page 1 of 1 |
| APPLICATION NO. | : 12/457402 | |
| DATED | : July 17, 2012 | |
| INVENTOR(S) | : Li-Pin Chang and Ming-Dar Chen | |

It is certified that error appears in the above-identified patent and that said Letters Patent is hereby corrected as shown below:

IN THE TITLE PAGE:
DELETE THE WORDS "This patent is subject to a terminal disclaimer"

Signed and Sealed this
Twenty-fifth Day of September, 2012

David J. Kappos
*Director of the United States Patent and Trademark Office*